(12) United States Patent
Ranjan et al.

(10) Patent No.: US 8,611,147 B2
(45) Date of Patent: Dec. 17, 2013

(54) SPIN-TRANSFER TORQUE MAGNETIC RANDOM ACCESS MEMORY (STTMRAM) USING A SYNTHETIC FREE LAYER

(71) Applicant: Avalanche Technology, Inc., Fremont, CA (US)

(72) Inventors: Rajiv Yadav Ranjan, San Jose, CA (US); Roger Klas Malmhall, San Jose, CA (US); Yiming Huai, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 13/849,062

(22) Filed: Mar. 22, 2013

(65) Prior Publication Data

US 2013/0229866 A1 Sep. 5, 2013

Related U.S. Application Data

(60) Division of application No. 13/437,908, filed on Apr. 2, 2012, now Pat. No. 8,422,286, and a continuation of application No. 12/907,913, filed on Oct. 19, 2010, now Pat. No. 8,169,821.

(51) Int. Cl.
*G11C 11/14* (2006.01)

(52) U.S. Cl.
USPC ........... 365/171; 365/148; 365/158; 365/172; 977/933; 977/935

(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 216/22; 257/421, E21.665; 438/3; 428/810–816, 817–825.1, 826; 977/933–935

See application file for complete search history.

(56) References Cited

U.S. PATENT DOCUMENTS

2009/0246557 A1* 10/2009 Horng et al. ............... 428/811.1
2010/0096716 A1* 4/2010 Ranjan et al. ............... 257/421

* cited by examiner

*Primary Examiner* — Harry W Byrne
(74) *Attorney, Agent, or Firm* — Maryam Imam; IPxLaw Group LLP

(57) ABSTRACT

A spin-torque transfer memory random access memory (STT-MRAM) element, employed in a STTMRAM array, receives electric current for storage of digital information, the STTM-RAM element has a magnetic tunnel junction (MTJ). The MTJ includes an anti-ferromagnetic (AF) layer, a fixed layer having a magnetization that is substantially fixed in one direction and that comprises a first magnetic layer, an AF coupling layer and a second magnetic layer, a barrier layer formed upon the fixed layer, and a free layer. The free layer is synthetic and has a high-polarization magnetic layer, a low-crystallization magnetic layer, a non-magnetic separation layer, and a magnetic layer, wherein during a write operation, a bidirectional electric current is applied across the STTM-RAM element to switch the magnetization of the free layer between parallel and anti-parallel states relative to the magnetization of the fixed layer.

22 Claims, 4 Drawing Sheets

SPIN-TRANSFER TORQUE MAGNETIC RANDOM ACCESS MEMORY (STTMRAM) USING A SYNTHETIC FREE LAYER

CROSS REFERENCE TO RELATED APPLICATIONS

This application is a divisional application of U.S. patent application Ser. No. 13/437,908, filed on Apr. 2, 2012, by "Rajiv Yadav Ranjan, et al.", and entitled "Low-crystallization temperature MTJ for Spin-Transfer Torque Magnetic Random Access Memory (STTMRAM)", which is a continuation of U.S. patent application Ser. No. 12/907,913, filed on Oct. 19, 2010, by Rajiv Yadav Ranjan, et al., and entitled "Low-crystallization temperature MTJ for Spin-Transfer Torque Magnetic Random Access Memory (STTMRAM)", which claims priority to U.S. Provisional Patent Application No. 61/253,864, filed on Oct. 20, 2009 by Rajiv Yadav Ranjan.

BACKGROUND OF THE INVENTION

1. Field of the Invention

The present invention relates to a spin-transfer torque magnetic random access memory (STTMRAM), and, more particularly, to an STTMRAM element having a low-crystallization temperature free layer MTJ structure.

2. Description of the Prior Art

Spin transfer torque magnetic random access memory (STTMRAM) is one of the next generations of non-volatile memory currently under development. In STTMRAM, writing magnetic bits is achieved by using a spin polarized current through the magnetic tunnel junction (MTJ), instead of using a magnetic field. The STTMRAM write current scales down with smaller MTJ size in future technology nodes. STTMRAM has significant advantages over magnetic-field-switched MRAM, which has been recently commercialized. One of the main drawbacks associated with field switched MRAM are its more complex cell architecture, which utilizes typically two additional metal lines for applying the switching field, in a one transistor and one MTJ design. These require additional processing steps and make the memory-cell size too big and too expensive. Additional drawback includes its high write current (currently in the order of milli Amps (mA)) and poor scalability, which is currently limited to about 65 nano meters (nm). On the other hand, in the STTMRAM, the spin transfer torque (STT) writing technology, by directly passing a current through the MTJ, overcomes these hurdles with much lower switching current (in the order of micro A) and ease scalability. This results in a simpler cell architecture that can be as small as 6 $F^2$ (for single-bit cells) and reduced manufacturing cost, and more importantly, improved scalability. Additionally, due to its fast read/write speed and lower voltage requirement, STTMRAM is believed to be an ideal candidate for replacing SRAM as an embedded memory into Logic devices such as from microprocessors.

Currently, most microprocessors and like logic devices utilize 40 to 80 percent of the memory area as SRAM. These SRAMs have extremely large cell size, and at the same time consumes large energy. This is becoming a limiting factor impacting the scaling of future microprocessors. Current MRAM and STTMRAM require processing temperatures requiring much higher temperature than 300 C.

What is needed is a non-volatile memory having smaller cell size that can easily be integrated into the back-end of the CMOS process and requires a low-temperature processing of typically below 300 C for a low-cost high volume manufacturing.

IN THE DRAWINGS

SUMMARY OF THE INVENTION

Figure 1:
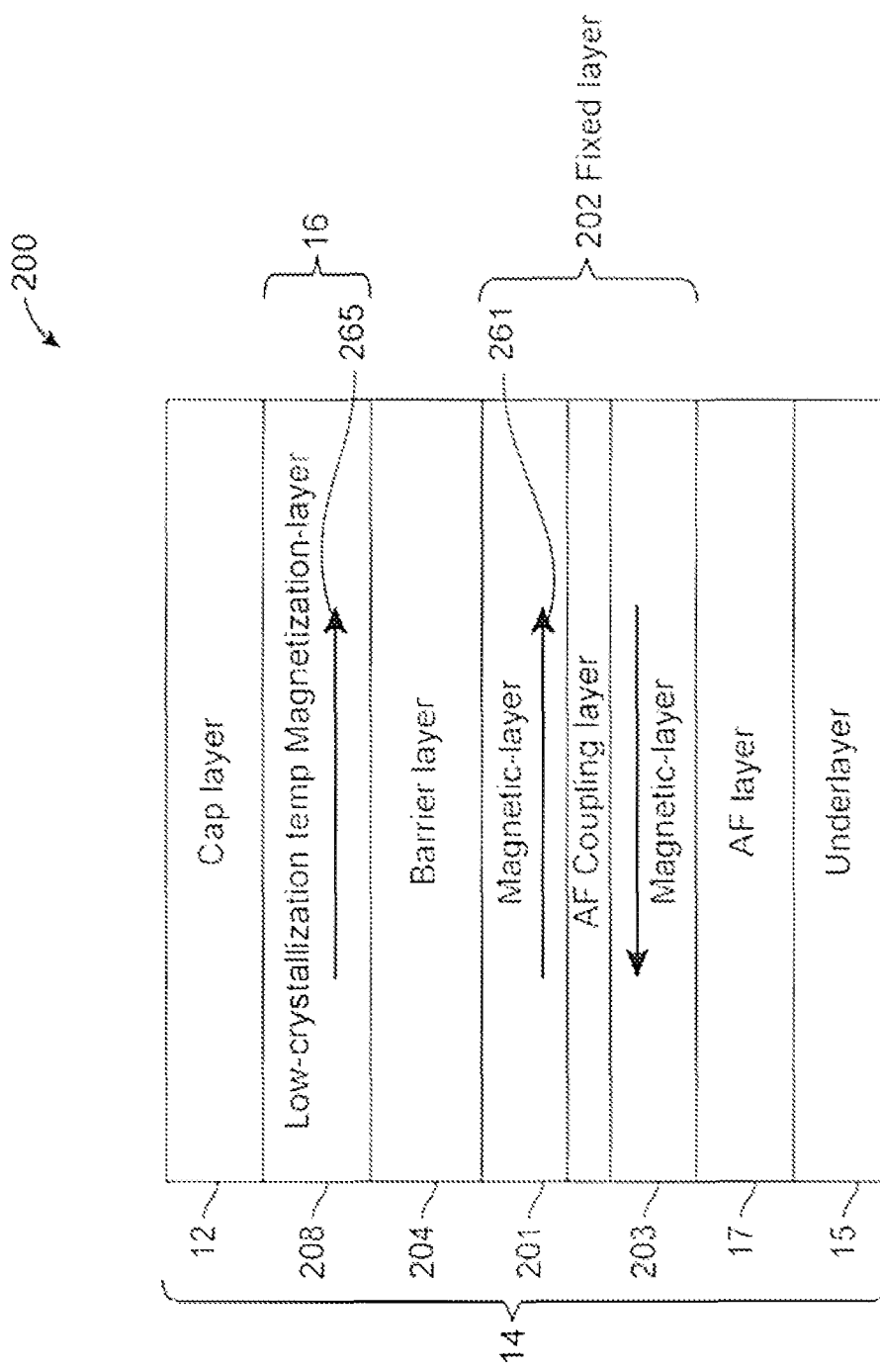
FIG. 1 shows a STTMRAM element 200, in accordance with an embodiment of the present invention.

Briefly, an embodiment of the present invention includes a spin-torque transfer memory random access memory (STTMRAM) element having a fixed layer, a barrier layer formed upon the fixed layer, and a free layer comprised of a low-crystallization temperature alloy of CoFeB—Z where Z is below 25 atomic percent of one or more of titanium, (Ti), yittrium (Y), zirconium (Zr), and vanadium (V), wherein during a write operation, a bidirectional electric current is applied across the STTMRAM element to switch the magnetization of the free layer between parallel and anti-parallel states relative to the magnetization of the fixed layer.

These and other objects and advantages of the present invention will no doubt become apparent to those skilled in the art after having read the following detailed description of the preferred embodiments illustrated in the several figures of the drawing.

DETAILED DESCRIPTION OF THE VARIOUS EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

In accordance with an embodiment of the present invention, a spin-transfer torque magnetic random access memory (STTMRAM) refers to a memory array composed of magnetic memory cells having spin torque transfer characteristics and including select transistors. The STTMRAM may include core (memory) and peripheral circuits, row and column decoders, sense amplifiers and the like. Various embodiments of the present invention are STTMRAM that requires lower magnetic annealing temperature while maintaining lower programming current density and higher thermal stability than that experienced by prior art STTMRAM.

One of the key processing steps for enabling the STTMRAM is the magnetic annealing process (described below in detail) when the wafer is annealed typically at 360 degrees Celsius (C) for achieving high performance of magnetic tunnel junction (MTJ) structure such as high tunnel magnetoresistance (TMR). It is understood that STTMRAM memory cells are formed of MTJs. For an integrated memory process such as for embedded memory for logic, a temperature of 300 degrees C. or below is contemplated.

It is known that the TMR ratio of MTJs made of cobalt iron boron (CoFeB) alloy/magnesium oxide (MgO)/cobalt iron boron (CoFeB) alloy where a Titanium capping layer is used is 1.4 times higher than the a standard MTJ where a Ta capping layer, typically for a lower annealing temperature such as 270 degree C. Prior art techniques have shown that Ti capping layer accelerated the diffusion of B from CoFeB free layer (of the MTJ) to the Ti capping layer at a lower temperature thereby lowering the crystallization temperature. A cyrtstallization temperature is where the amorphous CoFeB freelayer transforms into a crystalline structure. This is very well known in the art in that a high TMR associated with MTJs made of cobalt iron boron (CoFeB) alloy/magnesium oxide (MgO)/cobalt iron boron (CoFeB) alloy arises from the crystallization of the CoFeB from amorphous to crystal state during annealing. While this approach may work to cause lowering of the crystallization temperature, it is undesirable for making the STTMRAM memory for the following reasons:

(i) Ti capping layer does not lower the Ms, the saturation magnetization, and damping of the free layer. Hence the switching current is not reduced leading to a large-sized STTMRAM memory cell due to larger transistor requirements for providing the necessary switching current in a typical one-MTJ-one transistor design; and (ii) Thick Ti capping layer requires a more complex etching process during MTJ cell processing leading to higher manufacturing cost.

Various embodiments of the current invention circumvent these problems by incorporating the Ti and like elements into the CoFeB alloy of the free layer. This results in a lower Ms as the Ti and the like additive element dilute the magnetic moment of the free layer. For example, a ten atomic percent inclusion of Ti reduces the Ms of Co60Fe20B20 from about 1050 emu/cc to below 700 emu/cc. A 30 percent reduction in the saturation magnetization results in a fifty percent deduction in the switching current as the switching current is proportional to the $Ms^2$. In addition, the addition of Ti and like elements (mentioned below) to CoFeB alloy keeps the free layer largely amorphous following the crystallization (during magnetic annealing process). An amorphous free layer has been shown to have smaller damping constant and since the switching current is directly proportional to the damping constant, it further reduces the switching current.

STTMRAM element includes a magnetic tunnel junction (MTJ) having a fixed layer and a low-crystallization temperature free layer, and can include additional layers such as bottom and top electrodes which are required to integrate with the access transistor for forming the STTMRAM memory cell. The free layer is at least partly formed of magnetic alloy of CoFeB-X where X is one or more of Ti, Zr, Y and V. Addition of these elements to the free layer alloy makes the crystallization temperature required for achieving high MTJ performance, such as high TMR for MgO based MTJ to remain below 300 C while providing high TMR. While the detail composition range is described below, it should be pointed out that it is critical that the alloy contain boron, B. This is essential for lowering the damping constant while maintaining a lower Ms. A large number of low-Ms alloys used for forming the free layer of the MTJ do not include boron, B. While these alloys are likely to provide low Ms and therefore lower switching current density, they would not provide very low switching current density while maintaining high thermal stability.

In contrast, the boron, B, containing alloys in the free layer of the MTJ of the various embodiments of the present invention reduce the switching current density through reduction in saturation magnetization and reduction in damping constant of the free layer thereby providing low-switching current density while simultaneously maintaining higher thermal stability. In an exemplary embodiment, the switching current density is less than 1 mega ampere per centimeter squared ($MA/cm^2$) while maintaining high thermal stability. Thermal stability is commonly defined by KuV/kT where Ku represents magnetic anisotropy constant, V represents the volume of the free layer, k is Boltzmann's constant and T represents temperature. In an exemplary embodiment, high thermal stability is greater than 50.

Referring now to FIG. 1, a STTMRAM element 200 is shown in accordance with an embodiment of the present invention. Relevant layers of the STTMRAM element 200 are shown to comprise an underlayer 15 on top of which is formed an anti-ferromagnetic (AF) layer 17 on top of which is shown formed a fixed layer 202, on top of which is shown formed a barrier layer 204, on top of which is shown formed a low-crystallization temperature magnetic layer 208 on top of which is shown formed a cap layer 12. The AF layer 17, fixed layer 202, barrier layer 204, and low-crystallization temperature magnetic layer 208 (also referred to herein as the "low-crystallization temperature magnetic layer 16) collectively form the MTJ 14.

Fixed layer 202 is shown to include a magnetic layer 203 on top of which is formed AF coupling layer 21 on top of the which is shown formed magnetic layer 201. The layer 203 is formed on top of the layer 17 and the layer 201 is shown formed below the layer 204.

It is understood and well known that fixed layer 202 is typically formed on top of an anti-ferromagnetic (AF) layer, such as platinum manganese (PtMn), irridium manganese (IrMn), nickel managanese (NiMn) or iron manganese (FeMn) which is formed on top of an underlayer such as Ta. The layers 201 and 203 each have a ferromagnetic characteristic and an anti-parallel magnetization orientation relative to each other due to the Ruderman-Kittel-Kasuya-Yosida (RKKY) coupling through the AF coupling layer such as Ru separating the two ferromagnetic layers. This is well familiar in the art and such fixed layer is commonly referred to as synthetic AF layer. Cap layer 12 is shown formed on top of the free layer 16. The free layer 16 is made of or includes the low-crystallization temperature magnetic layer 208. The layer 204 is a barrier layer, typically made of MgO.

In one embodiment of the present invention, free layer 16, which is shown formed on top of the barrier layer 204 is comprised of only one layer of low-crystallization temperature free layer on top of which is formed cap layer 12, as shown in FIG. 1.

Figure 2:
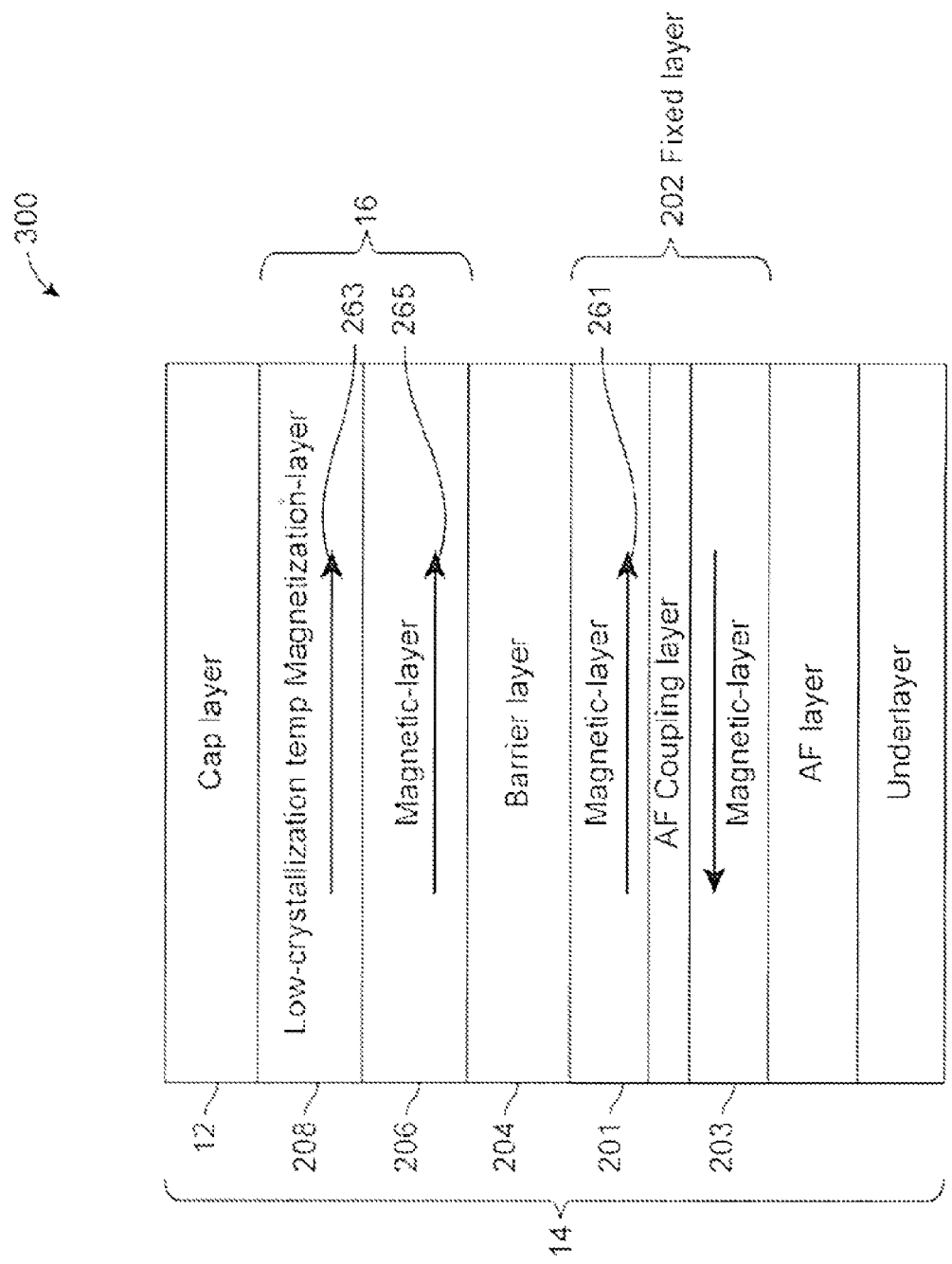
FIG. 2 shows a STTMRAM element 300, in accordance with another embodiment of the present invention.

While in the embodiment of FIG. 1, the free layer 12 is comprised of the low-crystallization temperature magnetic layer 208, which is only one layer, in other embodiments, another layer of high-polarization magnetic layer, made of CoFeB or the like is introduced between the low-crystallization temperature magnetic layer 208 and the barrier layer 204, as shown in FIG. 2. In FIG. 2, this high-polarization magnetic layer is the magnetic layer 206, which is shown formed on top of the barrier layer 204 and below the layer 208. Such structure is likely to have a higher TMR ratio. In embodiment shown in FIG. 2, layers 206 and 205 as strongly magnetically coupled to each other and their magnetization vectors 265 and 263 are aligned in the same direction, as shown in FIG. 2. The combined layers 206 and 208 are referred to as the free layer.

In the embodiment of FIG. 2, advantageously, boron (B), atoms of the high-polarization magnetic layer 206, are trapped easily by the Ti atoms of the low-crystallization magnetization layer 208, for a Co30Fe40B20Ti10 alloy, thereby lowering the annealing temperature. This is a key role of the additive elements Ti, Zr, V and Y to the low-crystallization layer 208.

Figure 3:
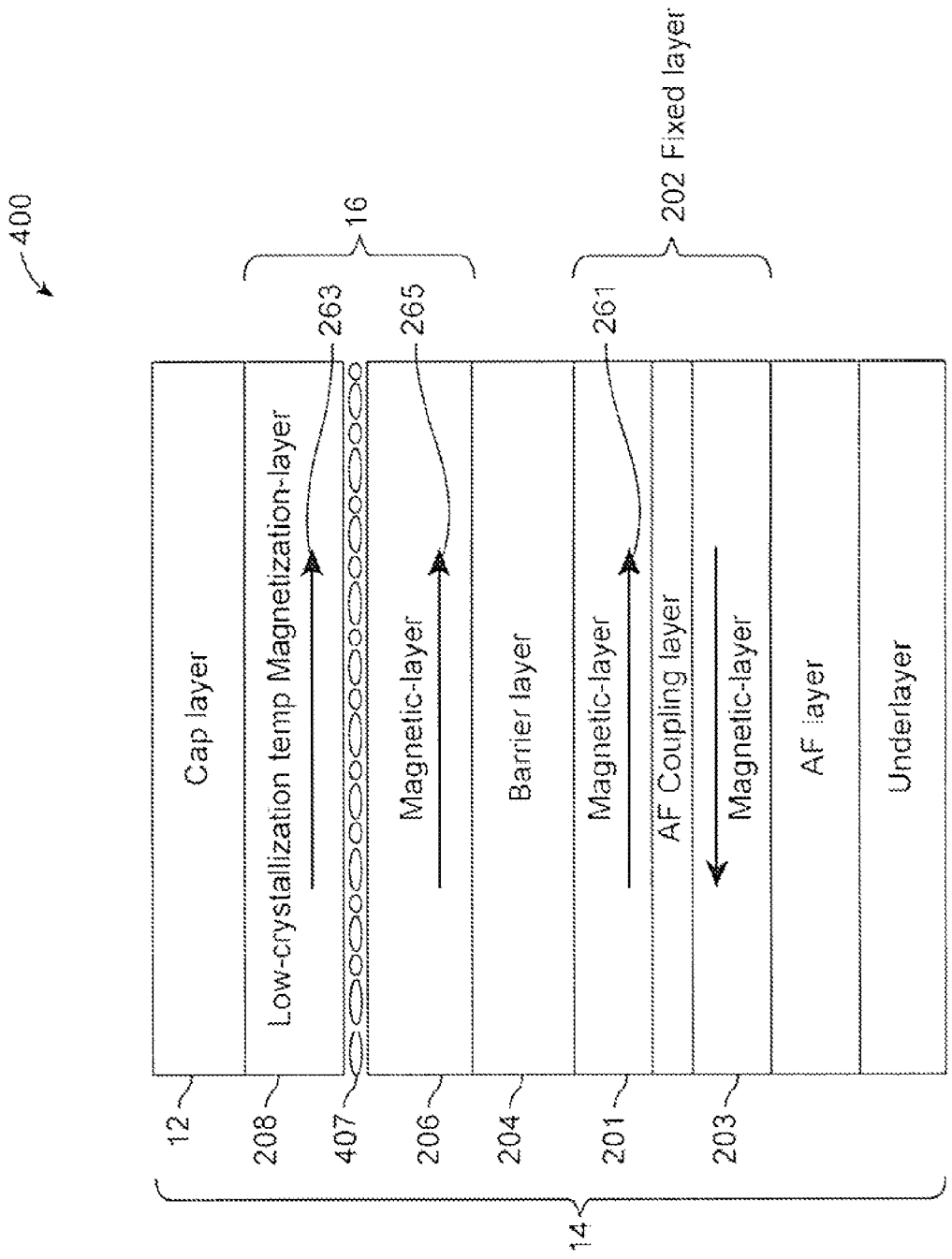
FIG. 3 shows a STTMRAM element 400, in accordance with another embodiment of the present invention.

In a yet another embodiment, as shown in FIG. 3 a non-magnetic layer 407 is introduced. The typical thickness of the non-magnetic-layer 407 is below 1 nm and can be conducting or non-conducting. In a preferred mode the layer is 0.1-0.5 nm thick and is conducting non-magnetic metal chosen from: Ta, Ti, Mo, Cr, V. In a yet another preferred mode 407 is 0.1 nm-0.2 nm of insulating layer comprised one or more of the oxides or nitrides from aluminum oxide (Al2O3), titanium oxide (TiO2), tantalum oxide (Ta2O5), hafnium oxide (HfO2), zirconium oxide (ZrO2), tungsten oxide (WO), niobium oxide (Nb2O5), chromium oxide (Cr2O3), silicon oxide (SiO2), yitrium oxide (Y2O3), vanadium oxide (VO2), Ruthenium oxide (RuO), Strontium oxide (SrO), Zinc oxide (ZnO), Magnesium oxide (MgO), titanium nitride (TiN), tantalum nitride (TaN), aluminum nitride (AlN), silicon nitride (SiN). In some embodiments, thickness of the magnetic layer 206 is typically greater than 0.4 nm while the thickness of each of the magnetic layers 208 is greater than 1 nano meter (nm). It should be noted that layer 407 likely grow as discontinuous film layers as indicated by the varying thickness in the figures are such chosen that the magnetic layers 206 and 208 of free layer 16 are ferromagnetically coupled and switch together as a single domain during the magnetization reversal to "parallel" (low resistance: Rl) and "anti-parallelizing" (high resistance: Rh) states at programming or writing.

Figure 4:
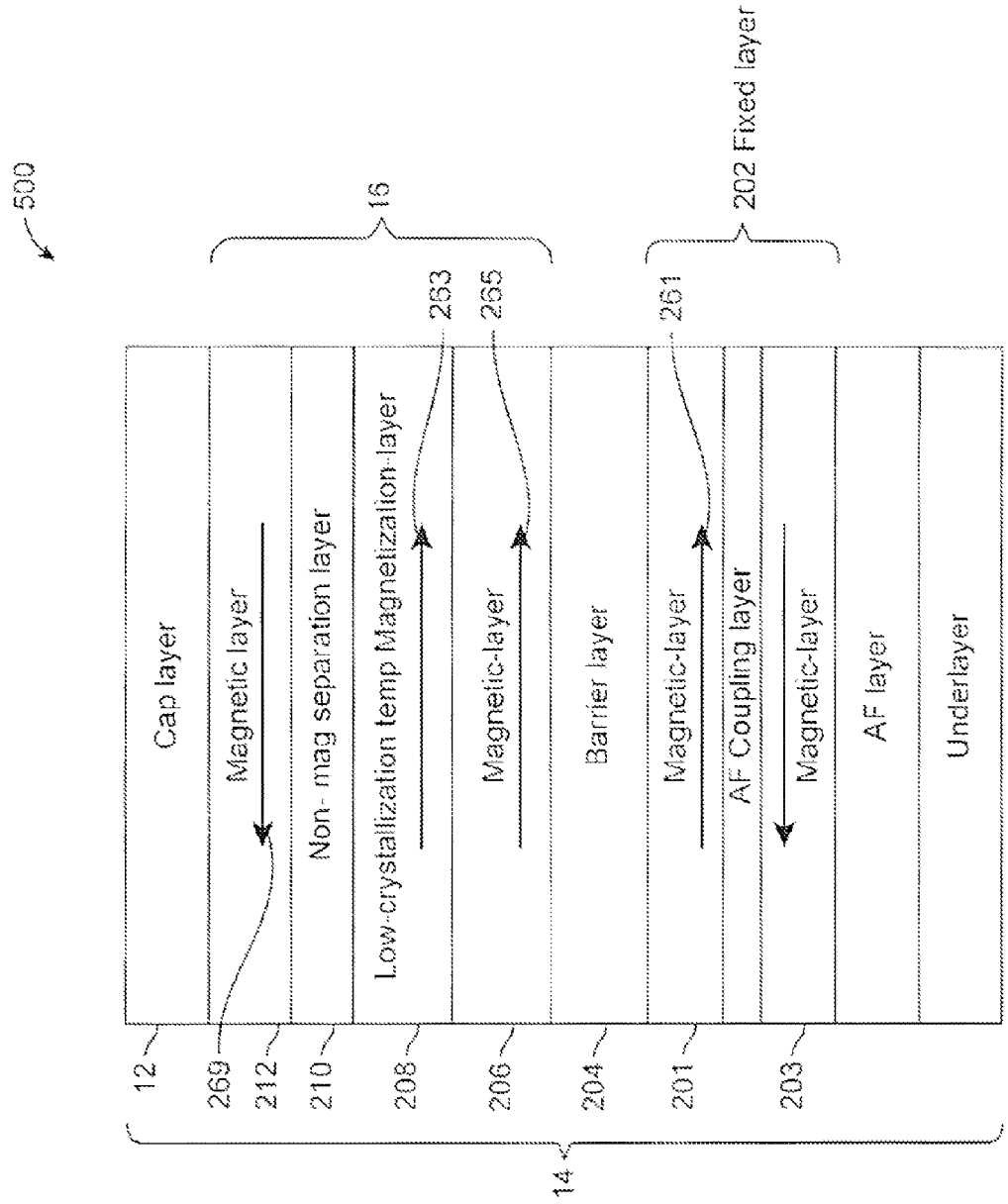
FIG. 4 shows a STTMRAM element 500, in accordance with another embodiment of the present invention.

In a yet another embodiment shown in FIG. 4, the free layer 14 is synthetic free layer which is comprised of high-polarization magnetic layer 206, low-crystallization magnetic layer 208, a non-magnetic separation layer 210 and a magnetic layer 212. The nonmagnetic separation layer 210 can be a conductor metal chosen from Cu, Ta, Ru or an insulating material chosen form MgO, $TiO_2$, ZnO, RuO and SrO. A typical layer thickness of the isolation layer is between 0.5 to 5.0 nm. The magnetic layer 212 is typically an alloy of CoFeB and can also be comprised of same alloy as the low-crystallization magnetic-layer 208. The magnetic orientation vector 269 of the magnetic layer, 212, is opposite to that of the layers 206 and 208 which are strongly coupled to each other as indicated by the arrows 265 and 263. The net demagnetizing field from the magnetic-layers 206 and 208 causes the magnetic orientation 269 of the magnetic-layer 212 to be oriented opposite to that of the magnetization vector of layers 206 and 208. Such structures are normally referred to as a synthetic layer.

The embodiment of FIG. 1 advantageously reduces programming current density and increases TMR. Where TMR= (Rh−Rl)/Rl where Rl refers to the resistance of magnetic tunnel junction 14 when the magnetic orientations of the fixed-layer 261 and the free layer 265 are parallel leading to a parallel-state, and Rh refers to the resistance when these orientations are anti-parallel to each other in an anti-parallel state.

It should be noted that magnetic layers 206, 208 of free layer 16 have their magnetization directions as shown by arrows 265, 263, respectively, pointed in same direction indicating that these layers are ferromagnetically coupled together through the discontinuous insulating layers. Thus, during the writing process all the magnetization orientations (or directions), as indicated by arrows 265, 263 rotate together to the low-resistance, Rl, (parallel-state) or the high-resistance, Rh, anti-parallel state.

During write operation, bidirectional electric current is applied from below fixed layer 202 or from above cap layer 12. In either manner, current flows through STTMRAM elements 200, 300 and 400 and causes the direction of magnetization of free layer 16 to change relative to fixed layer 202. That is, the direction of magnetization (or state) of free layer 16 is either parallel relative to fixed layer 202 or anti-parallel relative to fixed layer 202 and in this manner, STTMRAM element 200 is programmed to be either a binary '1' or '0' or vice versa.

In one embodiment, fixed layer 202 is a synthetic-fixed layer comprised of Cobolt Iron/Ruthenium/Cobolt Iron Boron (CoFe/Ru/CoFeB) alloy. In some embodiments, the low crystallization layer is comprised of a magnetic alloy of composition $Co_xFe(1-x)By$ Z where x is between 20-80 atomic percent, and y is between 10-30 at %, and Z is less than 25 atomic percent (at %) of one or more of titanium, Ti, yittrium, Y, zirconium, Zr, and vanadium, V. In one preferred embodiment the low temperature crystallization alloy for magnetic layer 208 has a composition of Co30Fe40B20Ti10 (all in atomic percent). In a yet another embodiment the composition is Co45Fe25B20Ti10 (all in atomic percent).

Barrier layer 204, which is also commonly referred to as tunneling barrier layer is typically much thicker than the thickness of each of the insulating layers in the free layer and in an exemplary embodiment is 0.5-2.0 nm (nano-meter) and can be chosen from one or more of magnesium oxide (MgO), ruthenium oxide (RuO), Strontium oxide (SrO), Zinc oxide (ZnO), Aluminum oxide (AlO), titanium oxide (TiO2). From materials point of view, the tunneling barrier layer and the insulating layer can be the same or different oxides or nitrides materials.

During the manufacturing, the deposition of the magnetic tunnel junction and the layers of the free layer 14 including the low-crystallization-magnetization layer 208 can be deposited by sequential sputtering through an in-line machine or a static sputtering or PVD machine. The alternate layers can also be deposited through multiple target by alternating sputtering the each layers or by co-sputtering from two and more targets. It is likely that these targets can be switched on alternating or with a time delay.

In the various embodiments of the present invention, the underline may be or may include as one of its layers as underlayers, metals layers, and likewise having on the top having cap layers and metal layers.

The STTMRAM element of the various embodiments of the present invention are submicron-sized or nano-scaled.

The structures including layers of the various drawings included herein are not drawn to scale.

It should be noted that while the reference is made only to the STTMRAM element, in the actual STTMRAM memory these elements are arranged in arrays while the individual STTMRAM elements are connected to in-series with an access transistor in a typical 1T-1MTJ (one transistor-one MTJ) design. The STTMRAM element and the access transistor are referred to as the STTMRAM memory element. The transistors are connected to the bit-lines and word-lines in a cross-line array and are connected to other select transistors, sense amps and reference-cell circuits. A group of the STTMRAM memory elements are addressed in the array through decoders such as row and column decoders which are connected to the various latches, and other logic functions to meet the timing and other requirements. Such a STTMRAM memory can be used for a number of applications as stand-alone memory such as for hand-held consumer devices, laptops, set-top-boxes etc. as well as for embedded application such as SOC or microprocessors.

It is understood that the magnetization of the fixed layer of the various STTMRAM elements herein is fixed while the magnetization of the free layer thereof is switchable. It is further understood that the STTMRAM elements herein may be employed in STTMRAM arrays with each array including a plurality of STTMRAM elements. During a write operation, where digital information is being programmed or stored in the STTMRAM elements of the various embodiments of the present invention, a bidirectional electric current is applied across the STTMRAM element to switch the magnetization of the free layer between parallel and anti-parallel states relative to the magnetization of the fixed layer.

Although the present invention has been described in terms of specific embodiment, it is anticipated that alterations and modifications thereof will no doubt become apparent to those more skilled in the art. It is therefore intended that the following claims be interpreted as covering all such alterations and modification as fall within the true spirit and scope of the invention.

What is claimed is:

1. A spin-torque transfer memory random access memory (STTMRAM) element, employed in a STTMRAM array, where the STTMRAM element received electric current for storage of digital information, the STTMRAM element comprising:
   a magnetic tunnel junction (MTJ) including,
      an anti-ferromagnetic (AF) layer;
      a fixed layer having a magnetization that is substantially fixed in one direction and that comprises a first magnetic layer, an AF coupling layer and a second magnetic layer;
      a barrier layer formed upon the fixed layer;
      a free layer is synthetic and comprised of a high-polarization magnetic layer, a low-crystallization magnetic layer, a non-magnetic separation layer, and a magnetic layer;
   wherein during a write operation, a bidirectional electric current is applied across the STTMRAM element to switch the magnetization of the free layer between parallel and anti-parallel states relative to the magnetization of the fixed layer.

2. The STTMRAM element, as recited in claim 1, wherein the high-polarization magnetic layer is made from CoFeB.

3. The STTMRAM element, as recited in claim 1, wherein the high-polarization magnetic layer has a thickness greater than 0.4 nano meters.

4. The STTMRAM element, as recited in claim 1, wherein the low crystallization layer is comprised of a magnetic alloy of a composition of $Co_xFe_{(1-x)}B_yZ$ wherein x is between 20-80 atomic percent, and y is between 10-30 atomic percentage, and Z is less than 25 atomic percent of one or more of titanium, yttrium, zirconium, and vanadium.

5. The STTMRAM element, as recited in claim 1, wherein the non-magnetic separation layer is conducting or non-conducting.

6. The STTMRAM element, as recited in claim 1, wherein the non-magnetic separation layer is a conductor metal made from copper, tantalum, or ruthenium.

7. The STTMRAM element, as recited in claim 1, wherein the non-magnetic separation layer is made of an insulating material comprising: magnesium oxide, titanium dioxide, zirconium oxide, or ruthenium oxide or strontium oxide.

8. The STTMRAM element, as recited in claim 1, wherein the non-magnetic separation layer has a thickness between 0.5 and 5.0 nano meters.

9. The STTMRAM element, as recited in claim 1, wherein the magnetic layer is made from CoFeB.

10. The STTMRAM element, as recited in claim 1, wherein the low-crystallization magnetic layer and the magnetic layer of the free layer each have a magnetization and further wherein, the magnetization of the low-crystallization magnetic layer of the free layer is opposite to that of the magnetic layer of the free layer.

11. The STTMRAM element, as recited in claim 1, wherein the low-crystallization magnetic layer has a composition of $Co_{30}Fe_{40}B_{20}Ti_{10}$ atomic percent.

12. The STTMRAM element, as recited in claim 1, wherein the low-crystallization magnetic layer has a composition of $Co_{45}Fe_{25}B_{20}Ti_{10}$ atomic percent.

13. The STTMRAM element, as recited in claim 1, wherein the barrier layer has a thickness between 0.5 and 2.0 nano meters.

14. The STTMRAM element, as recited in claim 1, wherein the barrier layer is made of a material comprising: magnesium oxide, ruthenium oxide, strontium oxide, zinc oxide, aluminum oxide, or titanium oxide.

15. A spin-torque transfer memory random access memory (STTMRAM) element, employed in a STTMRAM array, where the STTMRAM element received electric current for storage of digital information, the STTMRAM element comprising:
   a magnetic tunnel junction (MTJ) including,
      an anti-ferromagnetic (AF) layer;
      a fixed layer having a magnetization that is substantially fixed in one direction and that comprises a first magnetic layer, an AF coupling layer and a second magnetic layer;
      a barrier layer formed upon the fixed layer;
      a free layer is comprised of a low-crystallization magnetic layer, a non-magnetic layer, and a magnetic layer;
   wherein during a write operation, a bidirectional electric current is applied across the STTMRAM element to switch the magnetization of the free layer between parallel and anti-parallel states relative to the magnetization of the fixed layer.

16. The STTMRAM element, as recited in claim 15, wherein the non-magnetic layer is made of material comprising: Ta, Ti, Mo, Cr, or V.

17. The STTMRAM element, as recited in claim 15, wherein the non-magnetic layer is made of material comprising: oxides or nitrides from aluminum oxide (Al2O3), titanium oxide (TiO2), tantalum oxide (Ta2O5), hafnium oxide (HfO2), zirconium oxide (ZrO2), tungsten oxide (WO), niobium oxide (Nb2O5), chromium oxide (Cr2O3), silicon oxide (SiO2), yitrium oxide (Y2O3), vanadium oxide (VO2), Ruthenium oxide (RuO), Strontium oxide (SrO), Zinc oxide (ZnO), Magnesium oxide (MgO), titanium nitride (TiN), tantalum nitride (TaN), aluminum nitride (AlN), or silicon nitride (SiN).

18. The STTMRAM element, as recited in claim 15, wherein the non-magnetic layer has a thickness below 1 nano meters.

19. The STTMRAM element, as recited in claim 18, wherein the non-magnetic layer has a thickness below 0.1-0.5 nano meters.

20. A spin-torque transfer memory random access memory (STTMRAM) element, employed in a STTMRAM array, where the STTMRAM element received electric current for storage of digital information, the STTMRAM element comprising:
   a magnetic tunnel junction (MTJ) including,
      an anti-ferromagnetic (AF) layer;
      a fixed layer having a magnetization that is substantially fixed in one direction and that comprises a first magnetic layer, an AF coupling layer and a second magnetic layer;

a barrier layer formed upon the fixed layer;

a free layer comprised of a low-crystallization temperature magnetization layer made of a magnetic alloy of composition CoxFe (1-x)ByZ, where 'x' is between 20-80 atomic percent, and 'y' is between 10-30 atomic percent, and 'Z' is less than 25 atomic percept of one or more of the following materials: titanium, yttrium, zirconium, and vanadium, the free layer having a magnetization that is switchable;

wherein during a write operation, a bidirectional electric current is applied across the STTMRAM element to switch the magnetization of the free layer between parallel and anti-parallel states relative to the magnetization of the fixed layer.

21. The STTMRAM element of claim 20, wherein the low-crystallization temperature magnetization layer has a composition of Co30Fe40B20Ti10.

22. The STTMRAM element, as recited in claim 1, wherein the low-crystallization magnetic layer has a composition of Co45Fe25B20Ti10 atomic percent.

\* \* \* \* \*